(12) United States Patent
Sisley et al.

(10) Patent No.: US 8,643,501 B2
(45) Date of Patent: Feb. 4, 2014

(54) METERING APPARATUS (75) Inventors: James P. Sisley, Baden, PA (US); James Leo Lagree, Robinson Township, PA (US); Patrick Jay Woodham, McMurray, PA (US); Kevin Russell Hestad, McDonald, PA (US); Todd Michael Shaak, Presto, PA (US); Daniel Alan Hosko, Pittsburgh, PA (US)

(73) Assignee: Eaton Corporation, Cleveland, OH (US)

( * ) Notice: Subject to any disclaimer, the term of this patent is extended or adjusted under 35 U.S.C. 154(b) by 489 days.

(21) Appl. No.: 12/792,460

(22) Filed: Jun. 2, 2010

(65) Prior Publication Data

US 2011/0298625 A1 Dec. 8, 2011

(51) Int. Cl.
*G08B 21/00* (2006.01)

(52) U.S. Cl.
USPC ............. 340/638; 340/635; 340/652; 335/17; 324/424

(58) Field of Classification Search
USPC ............ 200/50.02–50.04; 324/424; D13/133, D13/137.1, 139.1, 139.6, 139.8, 158, 160, D13/173, 178; 361/601, 627, 634, 641, 644, 361/652, 673, 198; 340/870.02, 635, 638, 340/639, 636.12, 652, 309.6, 648
See application file for complete search history.

(56) References Cited

U.S. PATENT DOCUMENTS

| | | | |
|---|---|---|---|
| 4,250,476 A * | 2/1981 | Evans et al. ..................... 335/17 |
| 4,926,282 A * | 5/1990 | McGhie ......................... 361/102 |
| 5,420,799 A | 5/1995 | Peterson et al. |
| 5,754,113 A * | 5/1998 | Boyer ............................ 340/638 |
| 6,262,880 B1 * | 7/2001 | Fischer et al. ................. 361/652 |
| 7,362,207 B2 | 4/2008 | Malingowski et al. |
| 7,558,040 B2 | 7/2009 | Malingowski et al. |
| 2002/0105770 A1 | 8/2002 | Seese et al. |
| 2004/0228071 A1 | 11/2004 | Healy et al. |
| 2005/0267643 A1 * | 12/2005 | Watson ......................... 700/286 |
| 2008/0238701 A1 * | 10/2008 | Bickel et al. .................. 340/635 |
| 2009/0051557 A1 * | 2/2009 | Beatty et al. .................. 340/639 |
| 2009/0273873 A1 * | 11/2009 | Chiesi et al. ................. 361/93.1 |

FOREIGN PATENT DOCUMENTS

EP 2 028 677 A2 2/2009

OTHER PUBLICATIONS

European Patent Office, "extended European search report", Mar. 28, 2013, 7 pp.

* cited by examiner

*Primary Examiner* — Brian Zimmerman
*Assistant Examiner* — Sara Samson
(74) *Attorney, Agent, or Firm* — Eckert Seamans Cherin & Mellott, LLC; Brij K. Agarwal (57) ABSTRACT

A metering apparatus is connectable to the terminals of a circuit breaker and includes a detection apparatus that is configured to detect a status of the breaker and one or more operational parameters of the breaker. The metering apparatus may further include a communication apparatus that is configured to communicate the status of the breaker and/or one or more operational parameters of the breaker to another device. The metering apparatus may additionally include a power input that is independent of the breaker. Alternatively or additionally, the metering apparatus can be configured to communicate with the other device via any of a variety of established protocols, with the metering apparatus being capable of retrofitting to change the communications protocol by which it communicates with the other device.

11 Claims, 6 Drawing Sheets

METERING APPARATUS

BACKGROUND OF THE INVENTION

1. Field of the Invention

The disclosed and claimed concept relates generally to circuit interrupters and, more particularly, to a metering apparatus that is usable with a circuit interrupter.

2. Description of the Related Art

Numerous types of circuit interrupters, such as would include circuit breakers, are known in the art. Circuit breakers typically are employed to interrupt current to a circuit during various predefined overcurrent conditions, under-voltage conditions, and/or other conditions.

As is generally understood, a circuit breaker can either be in an ON condition, an OFF condition, or a TRIPPED condition. While the condition of such a circuit breaker typically can be discerned upon a visual inspection of the breaker, such a visual inspection often is impractical. Also, the determination of certain operational parameters of the breaker such as current flow and the like can be cumbersome to determine. It thus would be desirable to provide a way of overcoming these and other shortcomings of known circuit breakers.

SUMMARY OF THE INVENTION

These needs and others are met by an improved metering apparatus that is connectable to the terminals of a circuit breaker. The metering apparatus advantageously includes a detection apparatus that is configured to detect a status of the breaker and one or more operational parameters of the breaker. The metering apparatus further advantageously may include a communication apparatus that is configured to communicate the status of the breaker and/or one or more operational parameters of the breaker to another device. The metering apparatus may additionally include a power input that is independent of the breaker. Alternatively or additionally, the metering apparatus can be configured to communicate with the other device via any of a variety of established protocols, with the metering apparatus being capable of retrofitting to change the communications protocol by which it communicates with the other device.

Accordingly, an aspect of the disclosed and claimed concept is to provide an improved metering apparatus that is capable of communicating at least a first parameter of a circuit breaker to which the metering apparatus is connected.

Another aspect of the disclosed and claimed concept is to provide an improved metering apparatus having a power input that is independent of a circuit breaker to which the metering apparatus is connected.

Another aspect of the disclosed and claimed concept is to provide a metering apparatus that can communicate to another device various operational parameters of a circuit breaker, with such communication being in any of a variety of established communications protocols.

Accordingly, an aspect of the invention is to provide an improved metering apparatus, the general nature of which can be stated as including a support, a connection apparatus disposed on the support and structured to be electrically connected with a circuit interrupter, a detection apparatus disposed on the support and structured to detect at least a first operational aspect of the circuit interrupter, a communication apparatus in communication with the detection apparatus, the communication apparatus being disposed on the support and being structured to communicate to another device at least a first parameter of the circuit interrupter based at least in part upon the at least first operational aspect, and at least one of the detection apparatus and the communication apparatus comprising a power input structured to be electrically connected with a power source external to the circuit interrupter to make current available to the at least one of the detection apparatus and the communication apparatus.

Another aspect of the invention is to provide an improved metering apparatus, the general nature of which can be stated as including a support, a connection apparatus disposed on the support and structured to be electrically connected with a circuit interrupter, a detection apparatus disposed on the support and structured to detect at least a first operational aspect of the circuit interrupter, and a communication apparatus in communication with the detection apparatus, the communication apparatus being disposed on the support and being structured to communicate to another device a plurality of parameters of the circuit interrupter based at least in part upon the at least first operational aspect and including at least one of an ON status, an OFF status, and a TRIPPED status of the circuit interrupter and further including a number of additional parameters comprising one or more of a current, a voltage, a power factor, a reverse energy, a total energy, a total harmonic distortion, a harmonic percentage content, a waveform capture, and root-mean-squared voltage, a peak demand, and a present demand of the circuit interrupter.

Another aspect of the invention is to provide an improved metering apparatus, the general nature of which can be stated as including a support, a connection apparatus disposed on the support and comprising a number of first terminals and a number of second terminals, the number of first terminals being structured to be coupled with a number of terminals of a circuit interrupter and to pass current between the number of terminals of the circuit interrupter and the number of second terminals of the detection apparatus, a detection apparatus disposed on the support and structured to detect at least a first operational aspect of the circuit interrupter, and a communication apparatus in communication with the detection apparatus, the communication apparatus being disposed on the support and being structured to communicate to another device at least a first parameter of the circuit interrupter based at least in part upon the at least first operational aspect and including at least one of an ON status, an OFF status, and a TRIPPED status of the circuit interrupter.

BRIEF DESCRIPTION OF THE DRAWINGS

A further understanding of the disclosed and claimed concept can be gained from the following Description of the Preferred Embodiment when read in conjunction with the accompanying figures in which:

Similar numerals refer to similar parts throughout the specification.

DESCRIPTION OF THE PREFERRED EMBODIMENT

Figure 1:
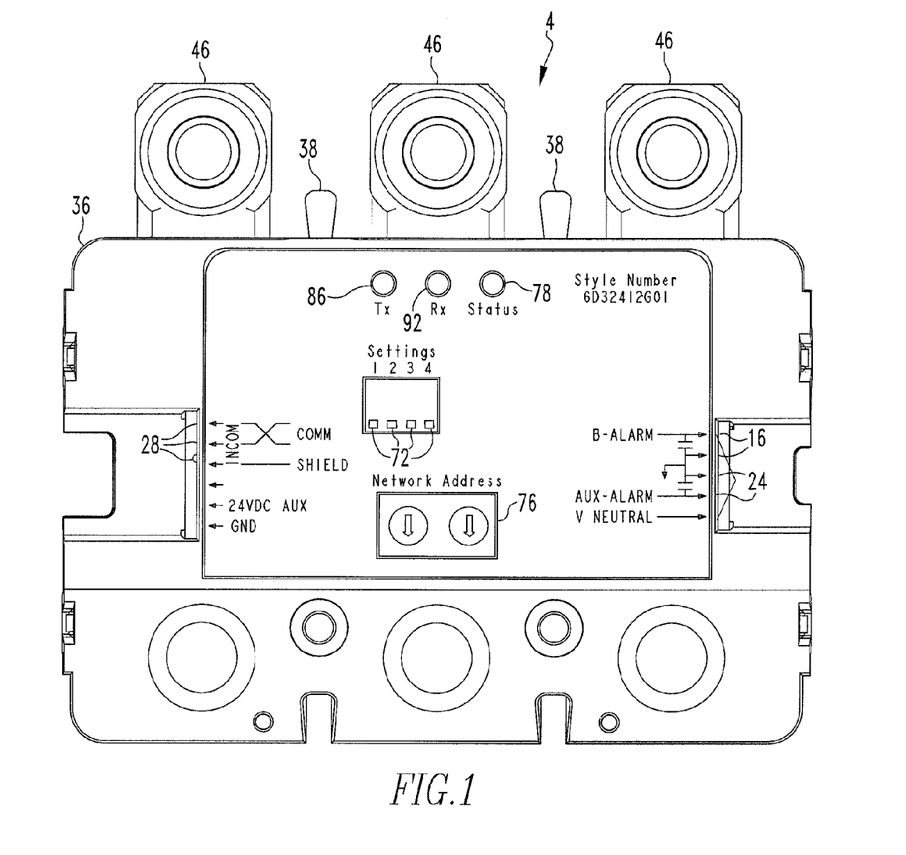
FIG. 1 is a top plan view of an improved metering apparatus in accordance with the disclosed and claimed concept.
Figure 5:
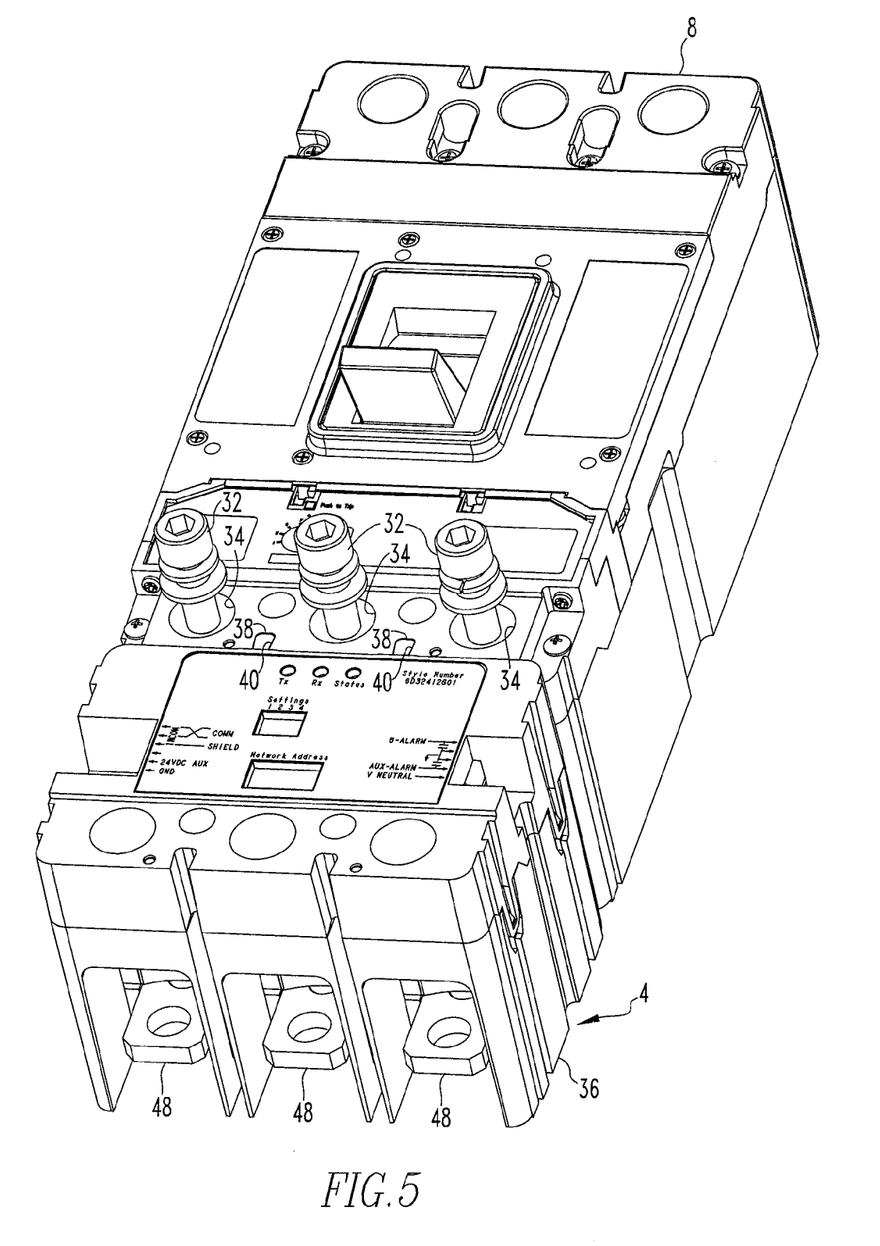
Figure 6:
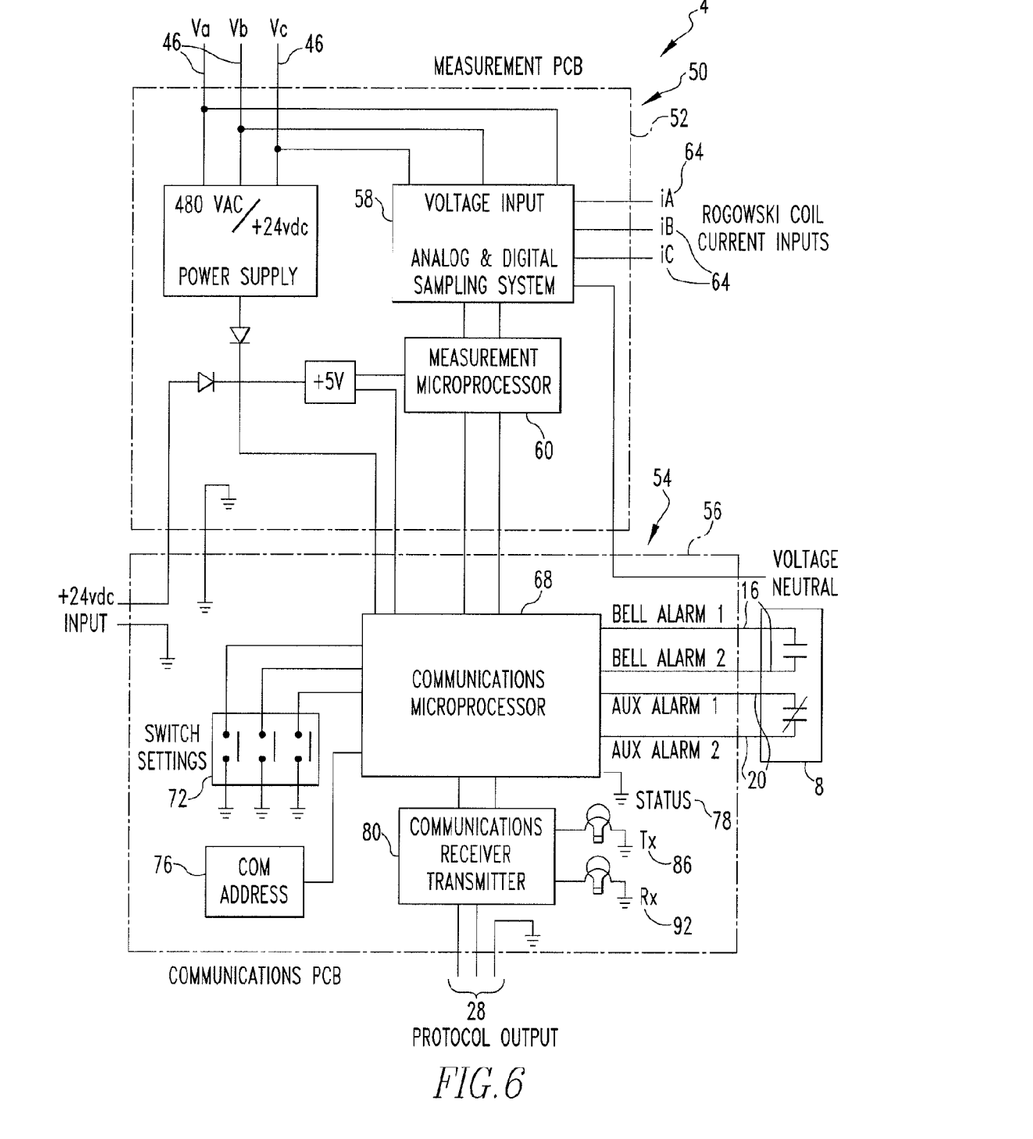
FIG. 6 is a schematic depiction of the metering apparatus of FIG. 1.

An improved metering apparatus 4 in accordance with the disclosed and claimed concept is indicated generally in FIGS. 1 and 6. The metering apparatus 4 is structured to be electrically connected with a circuit breaker 8, as is indicated generally in FIGS. 2-5. More particularly, the circuit breaker 8 includes a number of line terminals 10 and a number of load terminals 12 as is generally understood in the relevant art. As employed herein, the expression "a number of" and variations thereof shall refer broadly to any non-zero quantity, including a quantity of one. The metering apparatus 4 can be advantageously connected with either the line terminals 10 or the load terminals 12 of the circuit breaker 8, but in the embodiment depicted herein the metering apparatus 4 is depicted as being electrically connected with the load terminals 12.

Figure 2:
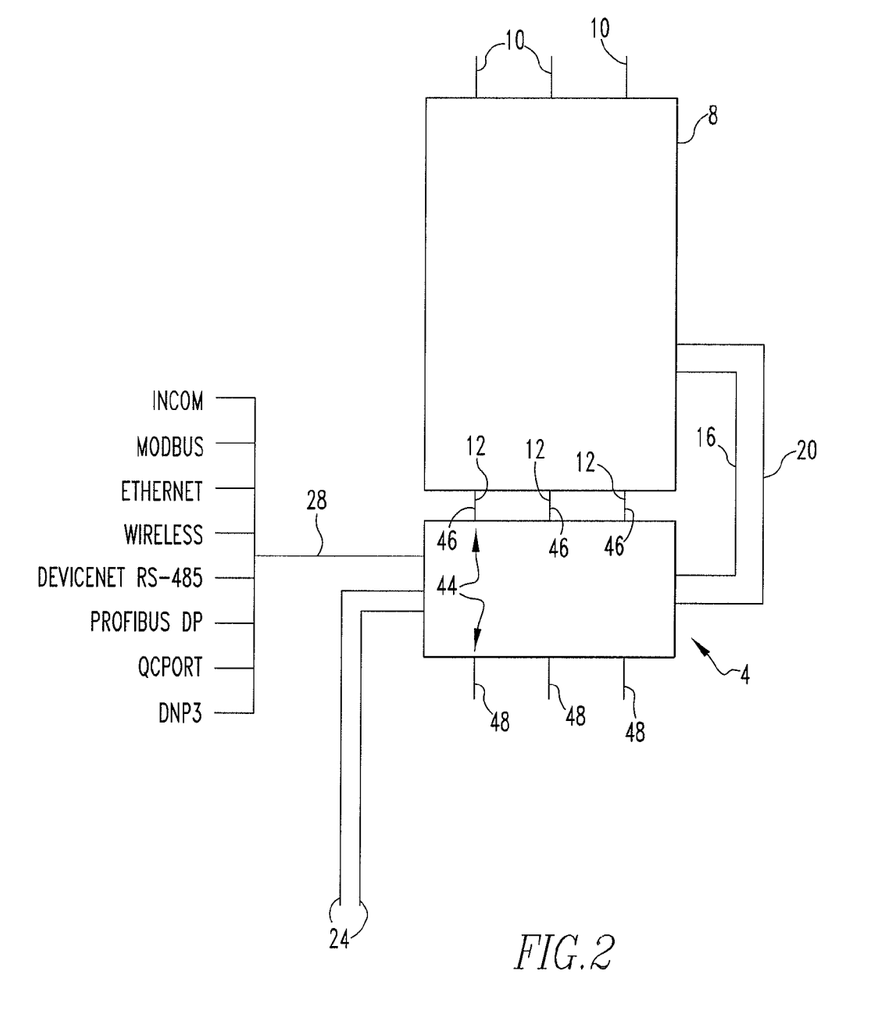
FIG. 2 is a schematic depiction of the metering apparatus of FIG. 1 operationally connected with a circuit breaker.

As can be understood from FIG. 2, the metering apparatus 4 includes a bell alarm input 16 that is connected with a bell alarm output of the circuit breaker 8, and further includes an auxiliary switch input 20 that is connected with an auxiliary switch output of the circuit breaker 8. The bell alarm input 16 and the auxiliary switch input 20 enable the metering apparatus 4 to determine whether the circuit breaker 8 has an operational status that is in an ON condition, an OFF condition, or a TRIPPED condition.

The metering apparatus 4 further includes an auxiliary power input 24 which can be independent of the circuit breaker 8 and which enables the metering apparatus 4 to be electrically powered even when the circuit breaker 8 is in an OFF or TRIPPED condition. In the exemplary embodiment depicted herein, the auxiliary power input 24 receives 24 volts DC, but other power inputs can be employed without departing from the present concept.

The metering apparatus 4 additionally includes a protocol output 28 that can provide communication to another device using any of a variety of established communications protocols. By way of example, the metering apparatus 4 can be configured to communicate with the other device using the INCOM communications protocol, and the INCOM protocol is the exemplary protocol employed in the depicted embodiment. Alternatively, the metering apparatus 4 can be configured to employ other communications protocols such as, for example and without limitation, ModBus, Ethernet, Wireless, DeviceNet RS-485, PROFIBUS DP, QCPort, and DNP3, although other communications protocols can be employed without departing from the present concept. Advantageously, the metering apparatus 4 can be retrofitted to use a different protocol in communicating with another device merely by removing and replacing a printed circuit board of the metering apparatus 4 with another circuit board, as will be set forth in greater detail below.

Figure 3:
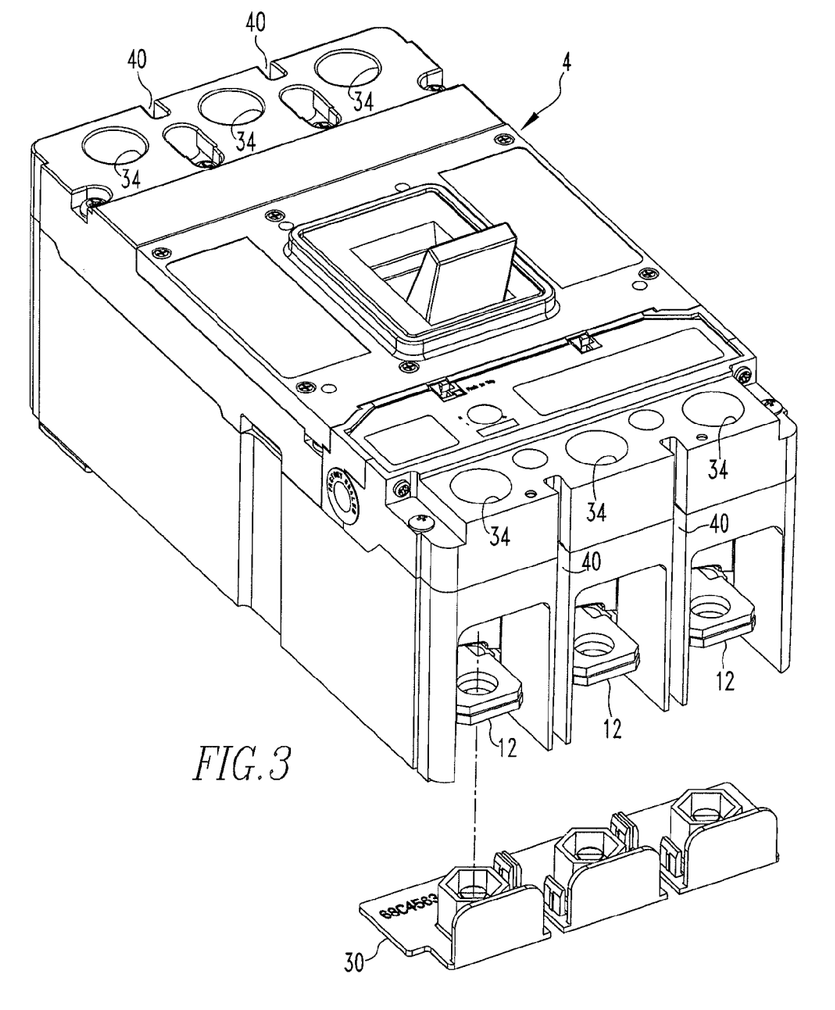
FIGS. 3, 4, and 5 depict the metering apparatus of FIG. 1 being electrically connected with a circuit breaker.
Figure 4:
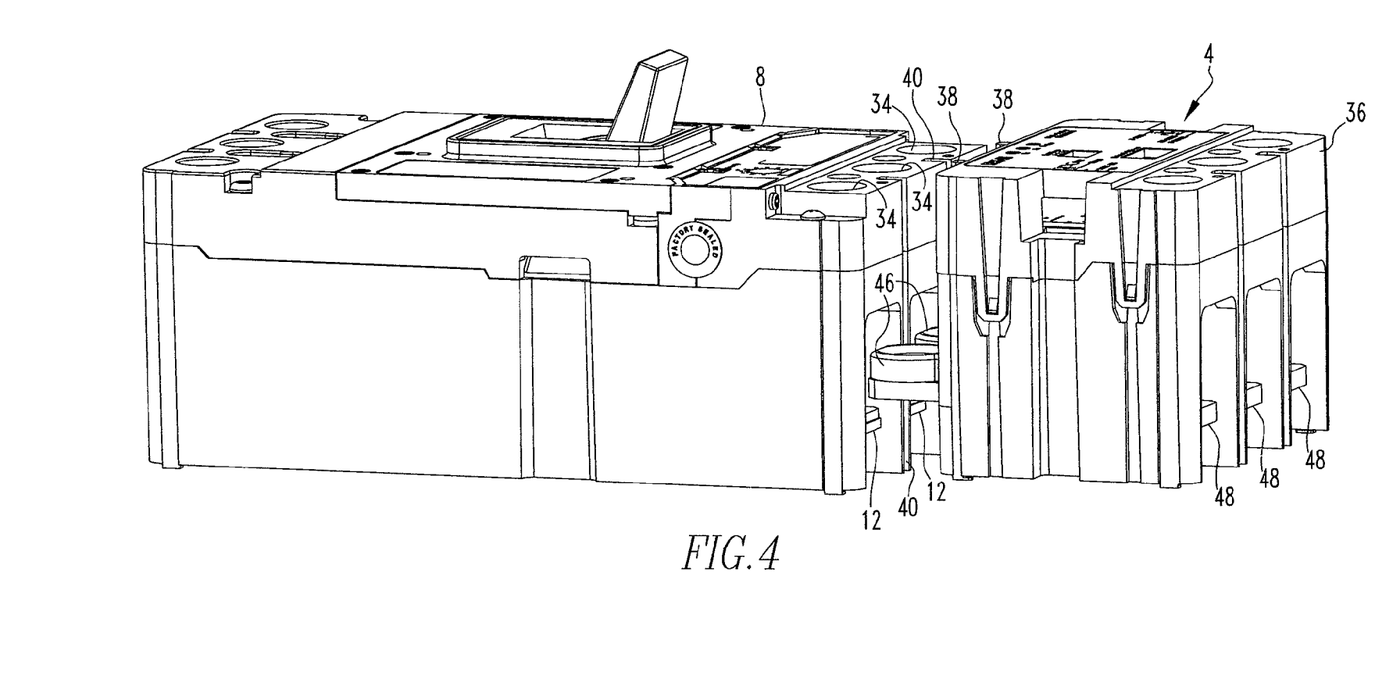

As can be understood from FIGS. 3-5, the metering apparatus 4 can be electrically connected with the line terminals 10 or the load terminals 12 of the circuit breaker 8 by using a connector 30 and a number of fasteners 32 that are received in holes 34 formed in the circuit breaker 8. The metering apparatus 4 includes a housing 36 formed with a number of protruding ribs 38 that are receivable in slots 40 formed on the circuit breaker 8. When the fasteners 32 are received in the holes 34 and are threadably connected with corresponding portions of the connector 30, the metering apparatus 4 is affixed to the circuit breaker 8 and is electrically connected with either the line terminals 10 or the load terminals 12 of the circuit breaker.

As can be understood from FIG. 6, the metering apparatus 4 can be said to include a connection apparatus 44 which, in the exemplary embodiment depicted herein, includes a plurality of input terminals 46 and a plurality of output terminals 48. The input terminals 46 are connectable with either the line terminals 10 or the load terminals 12 of the circuit breaker 8, but as suggested elsewhere herein, the input terminals 46 are depicted in the exemplary embodiment herein as being connected with the load terminals 12. The output terminals 48 can include various types of terminal lugs and wiring configurations as could be provided on the circuit breaker 8. The connection apparatus 44 of the metering apparatus 4 is configured to pass current between the input terminals 46 and the output terminals 48, whereby the metering apparatus 4 can be said to function as an extension of the circuit breaker 8.

The metering apparatus 4 can be said to further comprise a detection apparatus 50 that is disposed on the housing 36 and a communication apparatus 54 that is likewise disposed on the housing 36. In this regard, the housing 36 serves as a support to the connection apparatus 34, the detection apparatus 50, and the communication apparatus 54, and further can be said to enclose such components in whole or in part.

The detection apparatus 50 can be said to comprise a measurement printed circuit board (PCB) 52 that includes an analog and digital sampling system 58 and a measurement microprocessor 60 that are operationally connected together. The analog and digital sampling system 58 includes a voltage input for each pole of the circuit breaker 8 to which the metering apparatus 4 is connected. The detection apparatus 50 further includes a Rogowski coil 64 for each pole of the circuit breaker 8, and each Rogowski coil 64 provides a current input to the analog and digital sampling system 58.

The analog and digital sampling system 58 provides signals to the measurement microprocessor 60, which can have its own power input from the auxiliary power input 24. The measurement microprocessor 60 can employ the voltage and current data received from the analog and digital sampling system 58 to derive a variety of operational parameters of the circuit breaker 8. An exemplary set of operational parameters of the circuit breaker 8 are set forth in Table A, below, it being noted that other operational parameters or additional operational parameters or both can be provided by the measurement microprocessor 60 without departing from the present concept.

TABLE A

| Waveform Capture | Power Factor | Reverse Energy | Currents Ia Ib Ic (No Ig no In) | Time Stamping - Real time clock based on protocol |
|---|---|---|---|---|
| Harmonics % Content | Peak Demand | Forward Energy | Volts Va Vb Vc line to line | |
| Total Harmonic Distortion ($17^{th}$ or better Harmonic) RMS Sensing | Present Demand | Total Energy | Frequency Remote signal contacts - breaker status Aux/Bell | Revenue Grade Metering Digital display Use DigiView for displaying |
| MAC Address | Event capture | Communicate cause of trip (after breaker trips) based on observed conditions | | ITIC (CEBEMA) curves/data to see voltage sags |

The communication apparatus 54 can be said to comprise a communications printed circuit board (PCB) 56. In the exemplary embodiment depicted herein, the communications PCB 56 includes a communications microprocessor 68 and a communications receiver transmitter 80. Advantageously, the communications PCB 56 is configured to communicate with another device using an established protocol as mentioned elsewhere herein. Further advantageously, the communications PCB 56 can be removed from the housing 36 and replaced with an alternate communications PCB (not expressly depicted herein) that can employ a different protocol to communicate with the other device. Thus, the metering apparatus 4 can be upgraded to communicate using various communications protocols merely by swapping the communications PCB 56 with another.

The communications microprocessor 68 has as inputs the aforementioned bell alarm input 16 and auxiliary switch input 20 that are connected with the circuit breaker 8. The communications processor 68 further includes inputs from a number of settable switches 72 and a COM address storage 76, both of which are on the communications PCB 56. The communication microprocessor 68 can additionally include a power input from the auxiliary power 24. The communications microprocessor 68 further includes a STATUS output 78 that includes a status light on the housing 36 and that communicates to another device the status of the circuit breaker 8, i.e., whether the circuit breaker is an ON condition, an OFF condition, or a TRIPPED condition.

The communications microprocessor 68 derives the status of the circuit breaker 8 based upon inputs from the bell alarm 16 and the auxiliary switch input 20 using a known truth table. More particularly, the bell alarm input 16 indicates the handle position of the circuit breaker 8, which indicates whether or not the circuit breaker 8 is in a TRIPPED condition. The auxiliary input switch 20 indicates whether the contacts of the circuit breaker 8 are in an open or closed condition. By analyzing the inputs from the bell alarm input 16 and the auxiliary switch input 20, the communications microprocessor 68 can derive whether the circuit breaker 8 is an ON condition, an OFF condition, or a TRIPPED condition. The communications microprocessor 60 then can communicate to another device such a status of the circuit breaker 8 using the STATUS output 78 and can also visually provide the status by illuminating the status light that is disposed on the housing 36.

The communications microprocessor 68 further provides signals to the communications receiver transmitter 80 which employs an established protocol to communicate with another device using the protocol output 28. The protocol output 28 is connected with the other device (not expressly depicted herein) and employs one of a number of established protocols, an exemplary number of which are mentioned elsewhere herein. The other device to which the protocol output 28 is connected can be the same other device as that to which the STATUS output 78 is provided or may be yet another device. The communications receiver transmitter 80 is additionally connected with a transmit (Tx) status light 86 and a receiver (Rx) status light 92 which visually indicate when the communications transmitter 80 is transmitting and receiving, respectively, signals to and from, respectively, the other device.

The communications receiver transmitter 80 receives signals from the communications microprocessor 68 that are representative of one or more of the operational parameters set forth in Table A and that are, in turn, received from the measurement microprocessor 60 and have been derived from input to the analog and digital sampling system 58. As such, the status of the circuit breaker 8, which is communicated using the STATUS output 78 from the microprocessor 68, as well as the operational parameters of the circuit breaker 8 (such as are mentioned in Table A) that are transmitted from the communications receiver transmitter 80 using the protocol output 28, are derived from voltage, current, and other inputs to the analog and digital sampling system 58.

The metering apparatus 4 can further advantageously be configured according to the environment of its connection with circuit breaker 8. For instance, the input terminals 46 of the metering apparatus can be connected with either the line terminals 10 or the load terminals 12 of the circuit breaker 8.

In circumstance where the input terminals 46 are connected with the line terminals 10 of the circuit breaker 8, the communications receiver transmitter 80 might communicate a reverse energy value to the other device. The metering apparatus 4 thus can be configured to instead report forward energy instead of reverse energy in order to maintain consistency with other metering apparatuses 4 and circuit breakers 8, by way of example.

Moreover, the poles of the metering apparatus 4 can be reconfigured depending upon the needs of the application. As a default, the poles of the metering apparatus 4, as represented by the three input terminals 46 in FIGS. 1 and 6, are designated as A, B, and C when going left-to-right from the perspective of FIGS. 1 and 6. If necessary, the poles can be reconfigured to be designated as C, B, and A when moving from left-to-right from the perspective of FIGS. 1 and 6. Such a re-designation of the poles may be useful in any of a variety of applications, such as if the circuit breakers 8 and metering apparatuses 4 of a given switchgear cabinet (not expressly depicted herein) are mounted in two different orientations. This is a typical application since the line terminals of the switchgear cabinet are typically situated centrally on a switchgear cabinet and the load terminals are disposed peripherally on the switchgear cabinet. In such a scenario, the metering apparatuses 4 may be connected with the peripheral, load ends of the circuit breakers 8. However, the vertically uppermost pole of a metering apparatus 4 at one of the side of the switchgear cabinet might have a default designation of A whereas the vertically uppermost pole of a metering apparatus 4 on the opposite side of the switchgear cabinet might have a default designation of C. It thus may be desirable to alter the designation of such an uppermost pole from C to A and in order that all of the uppermost poles are A, and to re-designate a lowermost pole from A to C in order that all of the lowest poles are designated as C. Other uses of such a feature will be apparent.

It thus can be seen that the improved metering apparatus 4 can be connected with the poles of the circuit breaker 8 and can provide metering of various operational parameters and operational conditions of the circuit breaker 8. Such operational parameters and conditions can be communicated to another device using any of a variety of known protocols, which protocol can be changed merely by swapping the communications PCB 56 with another. The metering apparatus 4 additionally may include a power input that is independent of the circuit breaker 8 in order to enable the metering apparatus 4 to remain powered even if a circuit breaker 8 is in an OFF or TRIPPED condition.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof.

What is claimed is:

1. A metering apparatus comprising:
a support;
a connection apparatus disposed on the support and structured to be electrically connected with a circuit interrupter;
a detection apparatus disposed on the support and structured to detect at least a first operational aspect of the circuit interrupter;
a communication apparatus in communication with the detection apparatus, the communication apparatus being disposed on the support and being structured to communicate to another device at least a first parameter of the circuit interrupter based at least in part upon the at least first operational aspect;

the detection apparatus and the communication apparatus each comprising a power input structured to be electrically connected with a power source external to the circuit interrupter to make current available to the detection apparatus and the communication apparatus when the circuit interrupter is in an OFF or TRIPPED condition; and wherein the detection apparatus is structured to detect as the at least first operational aspect at least one of a condition of a bell alarm of the circuit interrupter and a condition of an auxiliary switch of the circuit interrupter, and wherein the communication apparatus is structured to communicate to the another device as the at least first parameter of the circuit interrupter at least one of an ON status, an OFF status, and a TRIPPED status of the circuit interrupter.

2. The metering apparatus of claim 1 wherein the detection apparatus is structured to additionally detect as the at least first operational aspect a voltage and a current for each of a number of poles of the circuit interrupter, and wherein the communication apparatus is structured to further communicate to the another device as the at least first parameter of the circuit interrupter a plurality of additional parameters of the circuit interrupter including one or more of a power factor, a reverse energy, a total energy, a total harmonic distortion, a harmonic percentage content, a waveform capture, and root-mean-squared voltage, a peak demand, and a present demand of the circuit interrupter.

3. The metering apparatus of claim 1 wherein the communication apparatus employs a predetermined communications protocol to communicate to the another device the at least first parameter of the circuit interrupter, the communication apparatus being removable from the metering apparatus and replaceable with another communication apparatus that employs another predetermined communications protocol to communicate to the another device the at least first parameter of the circuit interrupter.

4. The metering apparatus of claim 1 wherein the connection apparatus comprises a number of first terminals and a number of second terminals, the number of first terminals being structured to be coupled with a number of terminals of the circuit interrupter and to pass current between the number of terminals of the circuit interrupter and the number of second terminals of the detection apparatus.

5. A metering apparatus comprising:
a support;
a connection apparatus disposed on the support and structured to be electrically connected with a circuit interrupter;
a detection apparatus disposed on the support and structured to detect at least a first operational aspect of the circuit interrupter;
a communication apparatus in communication with the detection apparatus, the communication apparatus being disposed on the support and being structured to communicate to another device at least a first parameter of the circuit interrupter based at least in part upon the at least first operational aspect;
the detection apparatus and the communication apparatus each comprising a power input structured to be electrically connected with a power source external to the circuit interrupter to make current available to the detection apparatus and the communication apparatus when the circuit interrupter is in an OFF or TRIPPED condition; and wherein the detection apparatus is structured to detect as the at least first operational aspect at least one of a condition of a bell alarm of the circuit interrupter and a condition of an auxiliary switch of the circuit interrupter, and is structured to additionally detect as the at least first operational aspect a voltage and a current for each of a number of poles of the circuit interrupter, wherein the communication apparatus is structured to communicate to the another device at least one of an ON status, an OFF status, and a TRIPPED status of the circuit interrupter based at least in part upon the at least one of a condition of a bell alarm and a condition of an auxiliary switch, and wherein the communication apparatus is structured to communicate to the another device a number of additional parameters based at least in part upon at least one of the voltage and the current.

6. The metering apparatus of claim 5 wherein the communication apparatus employs a predetermined communications protocol to communicate to the another device the number of additional parameters of the circuit interrupter, the communication apparatus being removable from the metering apparatus and replaceable with another communication apparatus that employs another predetermined communications protocol to communicate to the another device the number of additional parameters of the circuit interrupter.

7. The metering apparatus of claim 5 wherein the connection apparatus comprises a number of first terminals and a number of second terminals, the number of first terminals being structured to be coupled with a number of terminals of the circuit interrupter and to pass current between the number of terminals of the circuit interrupter and the number of second terminals of the detection apparatus.

8. A metering apparatus comprising:
a support;
a connection apparatus disposed on the support and comprising a number of first terminals and a number of second terminals, the number of first terminals being structured to be coupled with a number of terminals of a circuit interrupter and to pass current between the number of terminals of the circuit interrupter and the number of second terminals of the detection apparatus;
a detection apparatus disposed on the support and structured to detect at least a first operational aspect of the circuit interrupter;
a communication apparatus in communication with the detection apparatus, the communication apparatus being disposed on the support and being structured to communicate to another device at least a first parameter of the circuit interrupter based at least in part upon the at least first operational aspect and including at least one of an OFF status and a TRIPPED status of the circuit interrupter; and
wherein at least one of the communication apparatus and the detection apparatus is structured to detect as the at least first operational aspect at least one of a condition of a bell alarm of the circuit interrupter and a condition of an auxiliary switch of the circuit interrupter, and wherein the communication apparatus is structured to communicate to the another device the at least one of an OFF status and a TRIPPED status of the circuit interrupter based at least in part upon the at least one of a condition of a bell alarm and a condition of an auxiliary switch.

9. The metering apparatus of claim 8 wherein at least one of the detection apparatus and the communication apparatus comprises a power input structured to be electrically connected with a power source external to the circuit interrupter to make current available to the at least one of the detection apparatus and the communication apparatus.

10. The metering apparatus of claim 8 wherein the detection apparatus is structured to additionally detect as the at least first operational aspect a voltage and a current for each of a number of poles of the circuit interrupter, and wherein the communication apparatus is structured to further communicate to the another device as the at least first parameter of the circuit interrupter a plurality of additional parameters of the circuit interrupter including one or more of a power factor, a reverse energy, a total energy, a total harmonic distortion, a harmonic percentage content, a waveform capture, and root-mean-squared voltage, a peak demand, and a present demand of the circuit interrupter.

11. The metering apparatus of claim 8 wherein the communication apparatus employs a predetermined communications protocol to communicate to the another device the at least first parameter of the circuit interrupter, the communication apparatus being removable from the metering apparatus and replaceable with another communication apparatus that employs another predetermined communications protocol to communicate to the another device the at least first parameter of the circuit interrupter.

* * * * *